US010636732B2

(12) United States Patent
Mohn et al.

(10) Patent No.: US 10,636,732 B2
(45) Date of Patent: Apr. 28, 2020

(54) POWER MODULE BASED ON MULTI-LAYER CIRCUIT BOARD

(71) Applicant: ABB Schweiz AG, Baden (CH)

(72) Inventors: Fabian Mohn, Ennetbaden (CH); Juergen Schuderer, Zürich (CH); Felix Traub, Birmenstorf (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/111,984

(22) Filed: Aug. 24, 2018

(65) Prior Publication Data

US 2018/0366400 A1 Dec. 20, 2018

Related U.S. Application Data

(63) Continuation of application No. PCT/EP2017/054208, filed on Feb. 23, 2017.

(30) Foreign Application Priority Data

Feb. 24, 2016 (EP) ..................... 16157209

(51) Int. Cl.
*H01L 23/48* (2006.01)
*H01L 23/52* (2006.01)
(Continued)

(52) U.S. Cl.
CPC ........ *H01L 23/49822* (2013.01); *H01L 23/13* (2013.01); *H01L 23/142* (2013.01);
(Continued)

(58) Field of Classification Search
None
See application file for complete search history.

(56) References Cited

U.S. PATENT DOCUMENTS 7,946,731 B1 * 5/2011 Wray .................. G09F 13/22
362/294
8,829,692 B2 9/2014 Rajashekara et al.
(Continued)

FOREIGN PATENT DOCUMENTS

DE 102013015956 A1 4/2014
EP 0597144 A1 5/1994
(Continued)

OTHER PUBLICATIONS

European Patent Office, International Search Report & Written Opinion issued in corresponding Application No. PCT/EP2017/054208, dated May 16, 2017, 12 pp.
(Continued)

*Primary Examiner* — Calvin Y Choi
(74) *Attorney, Agent, or Firm* — Taft Stettinius & Hollister LLP; J. Bruce Schelkopf

(57) ABSTRACT

A power module comprises at least one power semiconductor device with an electrical top contact area on a top side; and a multi-layer circuit board with multiple electrically conducting layers which are separated by multiple electrically isolating layers, the electrically isolating layers being laminated together with the electrically conducting layers; wherein the multi-layer circuit board has at least one cavity, which is opened to a top side of the multi-layer circuit board, which cavity reaches through at least two electrically conducting layers; wherein the power semiconductor device is attached with a bottom side to a bottom of the cavity; and wherein the power semiconductor device is electrically connected to a top side of the multi-layer circuit board with a conducting member bonded to the top contact area and bonded to the top side of the multi-layer circuit board.

20 Claims, 4 Drawing Sheets

(51) Int. Cl.
| | |
|---|---|
| *H01L 29/40* | (2006.01) |
| *H01L 23/498* | (2006.01) |
| *H01L 23/14* | (2006.01) |
| *H01L 23/538* | (2006.01) |
| *H01L 25/07* | (2006.01) |
| *H05K 1/18* | (2006.01) |
| *H05K 1/02* | (2006.01) |
| *H01L 23/13* | (2006.01) |
| *H01L 23/373* | (2006.01) |
| *H01L 23/00* | (2006.01) |
| *H05K 3/00* | (2006.01) |

(52) U.S. Cl.
CPC ...... *H01L 23/3735* (2013.01); *H01L 23/5383* (2013.01); *H01L 24/48* (2013.01); *H01L 24/49* (2013.01); *H01L 25/072* (2013.01); *H05K 1/0263* (2013.01); *H05K 1/183* (2013.01); *H01L 2224/0603* (2013.01); *H01L 2224/40225* (2013.01); *H01L 2224/48491* (2013.01); *H01L 2224/49111* (2013.01); *H01L 2224/49175* (2013.01); *H01L 2224/49431* (2013.01); *H01L 2224/49433* (2013.01); *H01L 2924/00014* (2013.01); *H01L 2924/10272* (2013.01); *H01L 2924/1203* (2013.01); *H01L 2924/1301* (2013.01); *H01L 2924/1304* (2013.01); *H01L 2924/13055* (2013.01); *H01L 2924/13091* (2013.01); *H01L 2924/15153* (2013.01); *H01L 2924/181* (2013.01); *H05K 1/0204* (2013.01); *H05K 1/0206* (2013.01); *H05K 3/0061* (2013.01); *H05K 2201/10166* (2013.01); *H05K 2201/10318* (2013.01)

(56) References Cited

U.S. PATENT DOCUMENTS

| | | | |
|---|---|---|---|
| 2003/0076659 A1* | 4/2003 | Ichitsubo et al. | H01L 23/13 361/748 |
| 2009/0039498 A1 | 2/2009 | Bayerer | |
| 2011/0127675 A1 | 6/2011 | Ewe et al. | |
| 2014/0061879 A1* | 3/2014 | Rajashekara et al. | H01L 24/49 257/666 |
| 2014/0070394 A1* | 3/2014 | Moriya et al. | H01L 23/34 257/690 |
| 2014/0246681 A1 | 9/2014 | Das et al. | |

FOREIGN PATENT DOCUMENTS

| | | |
|---|---|---|
| EP | 3113223 A1 | 1/2017 |
| WO | 9844557 A1 | 10/1998 |
| WO | 2005024946 A1 | 3/2005 |
| WO | 2016188909 A1 | 12/2016 |
| WO | 2018001983 A1 | 1/2018 |

OTHER PUBLICATIONS

European Patent Office, Extended Search Report issued in corresponding Application No. 16157209.4, dated Aug. 19, 2016, 8 pp.
R. Wang et al., A Novel Hybrid Packaging Structure for High-Temperature SiC Power Modules, IEEE Trans. Ind. Appl., vol. 49, p. 1609, 2013 (10 pages).
M. Meisser et al., Parasitics in Power Electronic Modules: How parasitic inductance influences switching and how it can be minimized, PCIM 2015 (2 pages).
C. Neeb et al., A 50 kW IGBT Power Module for Automotive Applications with Extremely Low DC-Link Inductance, EPE 2014 (10 pages).
Nippon Rika NRA-HIO, presented at PCIM 2015 (1 page).
S. Schoser et al., Highly Reliable Transfer-Molded Power Modules, Bodo's Power Systems, May 2015 (116 pages).
M. Ishihara et al., Power Modules for Electric and Hybrid Vehicles, Bodo's Power Systems, Jun. 2014 (68 pages).
K. Ohara et al., A New IGBT Module with Insulated Metal Baseplate (IMB) and 7th Generation Chips, PCIM 2015 (2 pages).
M. Horio et al., Ultra Compact and High Reliable SiC MOSFET Power Module with 200°( Operating Capability, ISPSD 2012 (4 pages).

* cited by examiner

POWER MODULE BASED ON MULTI-LAYER CIRCUIT BOARD

FIELD OF THE INVENTION

The invention relates to the field of packaging of power semiconductor devices. In particular, the invention relates to a power module based on multi-layer circuit board.

BACKGROUND OF THE INVENTION

Power semiconductor devices, such as IGBTs or Power MOSFETs, are used in various power electronics applications to switch or rectify electric currents. An important and fast growing application are converter systems for electric or hybrid electric vehicles. In this application, due to the limited available mounting volume, power density is an important requirement for the power electronics converter system. The use of alternative wide-bandgap semiconductor devices, such as silicon carbide (SiC) devices, promises further improvements in this respect.

An approach to reduce self-inductances and mutual inductances of power and signal circuits in a power module may be to route currents in multiple vertically stacked layers. For example, additional current carrying layers may be placed on top of a substrate. U.S. Pat. No. 8,829,692 B2 shows such layers form on a direct bonded copper substrate.

As proposed in DE 10 2013 015 956 A1, the power semiconductor devices may be completely embedded into a printed circuit board structure and may be directly contacted by copper vias.

Both of these approaches may have disadvantages regarding their manufacturability: The layering of multiple layers one after the other usually require additional bonding processes and the additional interfaces between the multiple layers may pose a risk for the reliability of the power module.

The complete embedding of power semiconductor devices on a printed circuit board, on the other hand, requires special top side metallization, and the process for drilling the vias for top side contacts may be limited regarding the maximum achievable via depths and consequently insulation thicknesses.

US 2014/070394 A1 shows a multi-layer circuit board with cavities, in which semiconductor elements are arranged. However, in US 2014/070394 A1, the heat dissipating substrate is spaced apart from the multi-layer circuit board with a further heat dissipating substrate.

WO 98/44557 A1 shows a multi-layer circuit board with cavities, in which semiconductor elements are arranged. At the bottom of the cavities, the semiconductor elements are attached to a cooling body, which is attached to the multi-layer circuit board.

Additionally, power modules are known from WO 2005/024946 A1, EP 0 597 144 A1, US 2003/076659 A1, US 2014/246681 A1, US 2009/039498 A1 and US 2011/127675 A1.

DESCRIPTION OF THE INVENTION

It is an objective of the invention to provide an easy to manufacture power module, which may have low stray impedance.

This objective is achieved by the subject-matter of the independent claims. Further exemplary embodiments are evident from the dependent claims and the following description.

The invention relates to a power module. A power module may be seen as a device, which comprises one or more power semiconductor devices (such as diodes, transistors, thyristors) together with further members mechanically supporting and electrically interconnecting these devices. The power semiconductor module as well as the power semiconductor devices may be adapted for processing currents of more than 10 A and/or more than 100 V.

According to an embodiment of the invention, the power module comprises at least one power semiconductor device with an electrical top contact area on a top side and optionally an electrical bottom contact area on a bottom side. The power semiconductor device may be or may comprise a semiconductor chip, and/or may comprise a transistor, diode, thyristor, etc. In particular, the power semiconductor device may be a SiC device, for example in a power range up to 1.2 kV, which may be especially suited for automotive applications.

The power semiconductor device may comprise a flat body which provides electrical contact areas (such as a drain and/or source area) on a top side or on opposite top and bottom sides. It has to be noted that the terms "bottom side" and "top side" do not specify a direction with respect to the earth surface, but merely describe opposite sides.

The power module further comprises a multi-layer circuit board with multiple electrically conducting layers which are separated by multiple electrically isolating layers. The electrically isolating layers may be based on plastics material (such as prepreg material) being laminated together with the electrically conducting layers. The multi-layer circuit board, which may be seen as a printed circuit board, may be assembled of multiple electrically conducting and electrically isolating layers, which have been joined together in one step. For example, electrically conducting structured layers providing conducting paths may be interlaced with prepreg material (such as epoxy resin impregnated fibre mats) and then pressed together while heated to form a multi-layer circuit board.

The multi-layer circuit board has at least one cavity, which is opened to a top side of the multi-layer circuit board, which cavity reaches through at least two electrically conducting layers. For example, the cavity may be generated by providing corresponding openings in specific layers of the multi-layer circuit board and/or by cutting out the cavity from an already formed multi-layer circuit board. The cavity may have walls extending substantially orthogonal with respect to the extension of the multi-layer circuit board and/or may have a bottom that extends substantially parallel to the extension of the multi-layer circuit board.

Furthermore, the power semiconductor device is attached to the bottom of the cavity. For example, the power semiconductor device may be bonded to the bottom of the cavity. The term "bonding" may refer to any process, which is adapted for mechanically and electrically connecting a device or metalized member with a metallization layer. Examples for such process are soldering or sintering.

On its other side, the power semiconductor device is electrically connected with an additional conducting member, such as a wirebond and/or a metal strip. In particular, the power semiconductor device is electrically connected to a top side of the multi-layer circuit board with a conducting member bonded (such as soldered, sintered and/or welded) with a first end to the top contact area and bonded (such as soldered, sintered and/or welded) with a second end to the top side of the multi-layer circuit board. The top side of the multi-layer circuit may provide a metal layer, which then interconnects the power semiconductor device with a terminal of the power module.

The power module may be easy to manufacture, since a complicated layering process for multiple electrically conducting layers is not necessary. A complicated current routing may be provided by the multi-layer circuit board, which may be manufactured more easily. In the multi-layer circuit board, only the power semiconductor devices have to be bonded, which after that easily may be connected via a further conducting member to the top side of the circuit board. Only a low number of manufacturing steps may be necessary, that may be largely automatized (pick and place, wire bonding, etc.).

Additionally, the power module may have beneficial electrical properties. The power module may have a high power density, since substrate area may be saved by routing currents in multiple layers in the multi-layer circuit board. Furthermore, the power module may have low stray impedances and couplings due to the high freedom of arranging electrically conducting paths in the multiple electrically conducting layers of the multi-layer circuit board.

According to an embodiment of the invention, the at least one power semiconductor device comprises an electrical bottom contact area on the bottom side, wherein the power semiconductor device is bonded with the bottom contact area to the bottom of the cavity. In such a way, electrical contact areas on different sides of the power semiconductor device may be electrically connected with the multi-layer circuit board. On the top side with wirebonds or other conducting members, on the bottom side by a bonding process.

According to an embodiment of the invention, the power module further comprises an electrically conducting bottom layer provided at a bottom side of the multi-layer circuit board, wherein the cavity reaches through the multi-layer circuit board to the bottom layer. The bottom layer also may provide the bottom of the cavity, i.e. the cavity may not reach completely through the multi-layer circuit board. In this case, the power semiconductor device may be bonded with the bottom contact area to the bottom layer.

According to an embodiment of the invention, the bottom layer is part of the multi-layer circuit board. The outermost bottom layer of the multi-layer circuit board may be a metal layer, i.e. the bottom layer may be an integral part of the multi-layer circuit board. The bottom layer may be used for bonding the multi-layer circuit board to a further metal substrate, which, for example, may be used as cooler.

A metal substrate may be a direct bonded copper substrate, an insulated metal substrate or a ceramics substrate.

It also may be possible that the bottom layer is provided by a metal substrate that forms an integral part of the multi-layer circuit board. The metal substrate may have been included into the multi-layer circuit board during the forming process of the multi-layer circuit board.

According to an embodiment of the invention, the bottom layer, which provides the bottom of the cavity and to which the semiconductor device is bonded, is bonded to the multi-layer circuit board. It also may be that the bottom layer is attached to the multi-layer circuit board after the forming process of the multi-layer circuit board. For example, the bottom layer may be bonded to a metallization layer provided by the multi-layer circuit board (after the forming process of the multi-layer circuit board). In this case, the cavity may reach completely through the multi-layer circuit board, i.e. the cavity may be a through-hole with respect to the multi-layer circuit board.

According to an embodiment of the invention, the bottom layer is part of an insulated metal substrate comprising the bottom layer and a further metal layer isolated from the bottom layer by an insulating layer or the bottom layer is part of a ceramics substrate comprising the bottom layer attached to a ceramics layer. As already mentioned, the further metal substrate may be either integrated into the multi-layer circuit board or may be bonded to the multi-layer circuit board.

According to an embodiment of the invention, at least two multi-layer circuit boards with cavities, in which power semiconductor devices are bonded, are attached to a common (metal) substrate. Each of the at least two multi-layer circuit boards may be designed as described in the above and in the below. Also, the at least two multi-layer circuit boards may be equally designed and two, three or more equally designed circuits (such as half-bridges) may be provided on one substrate in one power module.

The top sides of the at least two multi-layer circuit boards may be electrically interconnected with wirebonds, for example for interconnecting gate layers provided in different multi-layer circuit boards. In such a way, only one gate terminal may be provided by the power module, although two or more circuits are connected in parallel.

According to an embodiment of the invention, the bottom layer or a metal layer attached to the bottom layer has a structured bottom surface for cooling. The bottom layer may be a metal layer either integrated into the multi-layer circuit board or bonded to the multi-layer circuit board. The metal layer may be a metal layer provided by a metal substrate with two isolated metal layers either integrated into the multi-layer circuit board or bonded to the multi-layer circuit board. The structured bottom surface may comprise fins and/or posts, which enlarge an effective cooling surface of the power module. It also may be possible that (liquid) cooling channels are provided in the structured bottom surface.

In general, the power module may comprise a multi-layer circuit board with an integrated or bonded metal substrate. The power module may be easy to manufacture at low cost. For example, when the metal substrate is already integrated on the side of the manufacture of the multi-layer circuit board, the assembly process on the side of the module manufacture may basically only comprise die attachment, wire bonding, power and auxiliary terminal attachment (only if terminals are not integrated into the multi-layer circuit board, and optionally mold encapsulation). The manufacturing may be performed in a large-panel manufacturing process that may be well suited for large-volume production for the cost-sensitive automotive market.

When the isolating layers (such as prepreg based layers) of the multi-layer circuit board, the metal substrate and an optional electrically isolating mold encapsulation (such as epoxy resin) are CTE (coefficient of thermal expansion)-matched to copper, the power module may achieve a high reliability. Only the one or more power semiconductor devices may then have a significantly different coefficient of thermal expansion, but this may be less critical for SiC semiconductor devices, which usually have smaller chip areas than Si semiconductor devices. Also the number of bonded contact areas may be reduced compared to other types of power modules, which also may improve the reliability. For example, there may be only one sintered contact area between the semiconductor device and the bottom layer for every semiconductor device, when the bottom layer is directly cooled.

According to an embodiment of the invention, the power semiconductor device is completely received in the cavity, i.e. the top side of the power semiconductor device does not protrude from the cavity. Thus, the space above the power semiconductor device may be used for wiring without further increasing the height of the power module.

According to an embodiment of the invention, the at least one power semiconductor device has a gate contact area on the top side, which is electrically connected to the top side of the multi-layer circuit board. It may be that one power semiconductor device is a power semiconductor switch, which gate is interconnected via metal layers in the multi-layer circuit board with a gate terminal of the power module.

According to an embodiment of the invention, the multi-layer circuit board comprises at least two cavities, in which at least two power semiconductor devices are attached (for example bonded) with its bottom sides to the bottoms of the cavities. Thus, the multi-layer circuit board may provide the electrical connections for more than one power semiconductor device with terminals of the power module. It may be that every power semiconductor device is positioned in a separate cavity or that two or more power semiconductor devices (such as a switch and an antiparallel freewheeling diode) are positioned in one cavity.

According to an embodiment of the invention, the power semiconductor device is electrically connected via wirebonds as conducting member to the top side of the multi-layer circuit board. For example, the wirebonds may be bonded to the top contact area of the power semiconductor device and to a metal layer provided by the top side of the multi-layer circuit board. It also may be that the power semiconductor device is electrically connected via a metal strip as conducting member to the top side of the multi-layer circuit board. A metal strip may be a folded member, which may be more rigid than the wire of a wirebond.

According to an embodiment of the invention, a metal buffer layer is bonded to the top contact area of the power semiconductor device and the conducting member interconnecting the top contact area with the top side of the multi-layer circuit board is bonded to the metal buffer layer. The metal buffer layer may be a metal block, which may be much thicker (such as 10 times thicker) than the electrical contact area of the power semiconductor device to which it is bonded. Such a metal buffer layer may improve a wirebond interconnection and/or may distribute heat in the power semiconductor device more uniformly.

According to an embodiment of the invention, the multi-layer circuit board comprises a first electrically conducting layer and a second electrically conducting layer, which are electrically connected to the top contact area and the bottom contact area of the power semiconductor device. The first layer and the second layer may provide a current path between a first terminal and the power semiconductor device as well as between a second terminal and the power semiconductor device. It has to be noted that first and second layers may be divided into parts, which are electrically isolated from each other in the respective layer. These parts may be interconnected with other parts of other layers with vias.

Furthermore, the parts of one layer may be electrically connected to different terminal, i.e. may have different potential, when the power module is operating.

Furthermore, in the case of a power semiconductor switch, one or more gate layers may be provided by the multi-layer circuit board.

When electrically conducting parts of the first, the second and/or the gate layer are overlapping each other substantially and/or are extending over most of the base area of the multi-layer circuit board, this may result in low-inductance current paths, greatly reduced gate inductance and gate/power circuit couplings, as well as improved power density by saving footprint area of the power module by routing the currents in multiple layers.

According to an embodiment of the invention, the (electrically conducting parts of the) first electrically conducting layer and the second electrically conducting layer are overlapping each other in at least more than 10% of an area of the top side or bottom side of the multi-layer circuit board. The area of the top side or bottom side of multi-layer circuit board (which usually are equal) may be seen as the base area of the multi-layer circuit board. Substantially overlapping may mean that more than 10% of an area of the conducting layers is overlapping, when viewed from a direction orthogonal to an extension of the top and/or bottom side of the multi-layer circuit board.

A current routing in multiple overlapping layers may allow to reduce module-internal parasitic inductances. For example, the commutation loop stray inductance may be significantly reduced, when a current between DC− terminals is led in parallel through the first and second conducting layer in close distance.

According to an embodiment of the invention, the (electrically conducting parts of the) first electrically conducting layer and/or the second electrically conducting layer extend over more than 50% of the area of the top side or bottom side of the multi-layer circuit board. When the first and/or second electrically conducting layers are extending laterally over a significant fraction of the base area of the multi-layer circuit board, this also may result in low-inductance interconnections.

Also, (electrically conducting parts of) one or more gate layers may extend over more than 50% of the area of the top side or bottom side of the multi-layer circuit board.

According to an embodiment of the invention, the first electrically conducting layer and/or the second electrically conducting layer are thicker than a third electrically conducting gate layer electrically interconnected with a gate contact area of the power semiconductor device. It may be possible that one or more gate layers are thinner than the current conducting layers, thus reducing the heights of the multi-layer circuit board.

Furthermore, the one or more gate layers may overlap for more than 10% of an area of the first and/or second conducting layers. A large-area gate layer used for routing the gate signal also may reduce a gate inductance and a coupling inductance between gate and power circuits compared to a conventional power module.

According to an embodiment of the invention, electrically conducting layers (such as the first, second and/or gate layer) of the multi-layer circuit board are interconnected by conducting vias extending through the multi-layer circuit board orthogonal to the electrically conducting layers. For example, these vias, which may extend vertically, may be posts or other structures extending through the isolation layers between the conducting layers. It may be possible that vias interconnect neighbouring electrically conducting layers, and/or electrically conducting layers, which are spaced apart more than one electrically conducting layer. It also may be possible that vias reach through the multi-layer circuit board from the top side to the bottom side, or reach through only partially.

According to an embodiment of the invention, the power module comprising at least two power semiconductor switches electrically interconnected by the electrically conducting layers of the multi-layer circuit board, a bottom layer (which may be part of the multi-layer circuit board) and conducting members to form a half-bridge. Furthermore, the power module may comprise a freewheeling diode connected antiparallel to one or more power semiconductor switches. The power semiconductor switch(es) and the freewheeling diodes may be positioned in cavities of the multi-layer circuit board as described in the above and the below.

According to an embodiment of the invention, terminals for connecting an external connection of the module are directly bonded to the top side of the multi-layer circuit board and/or are part of the multi-layer circuit board. For example, these terminals (which may be terminals for DC−, DC+, AC currents and/or gate signals) may be provided by metal strips, which are bonded to respective electrical contact areas provided by a top layer of the multi-layer circuit board.

According to an embodiment of the invention, the multi-layer circuit board and the power semiconductor device in the cavity are encapsulated into a plastics material. For example, the power module may be at least partially encapsulated using an epoxy mold compound. The top side of the multi-layer circuit board, its sides and in particular, the cavities and the conducting member may be completely encapsulated. It may be possible that only terminals and/or a cooling surface protrude from the encapsulation. Such an electrically isolating and/or mechanically stabilizing encapsulation may enhance a wirebond lifetime.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
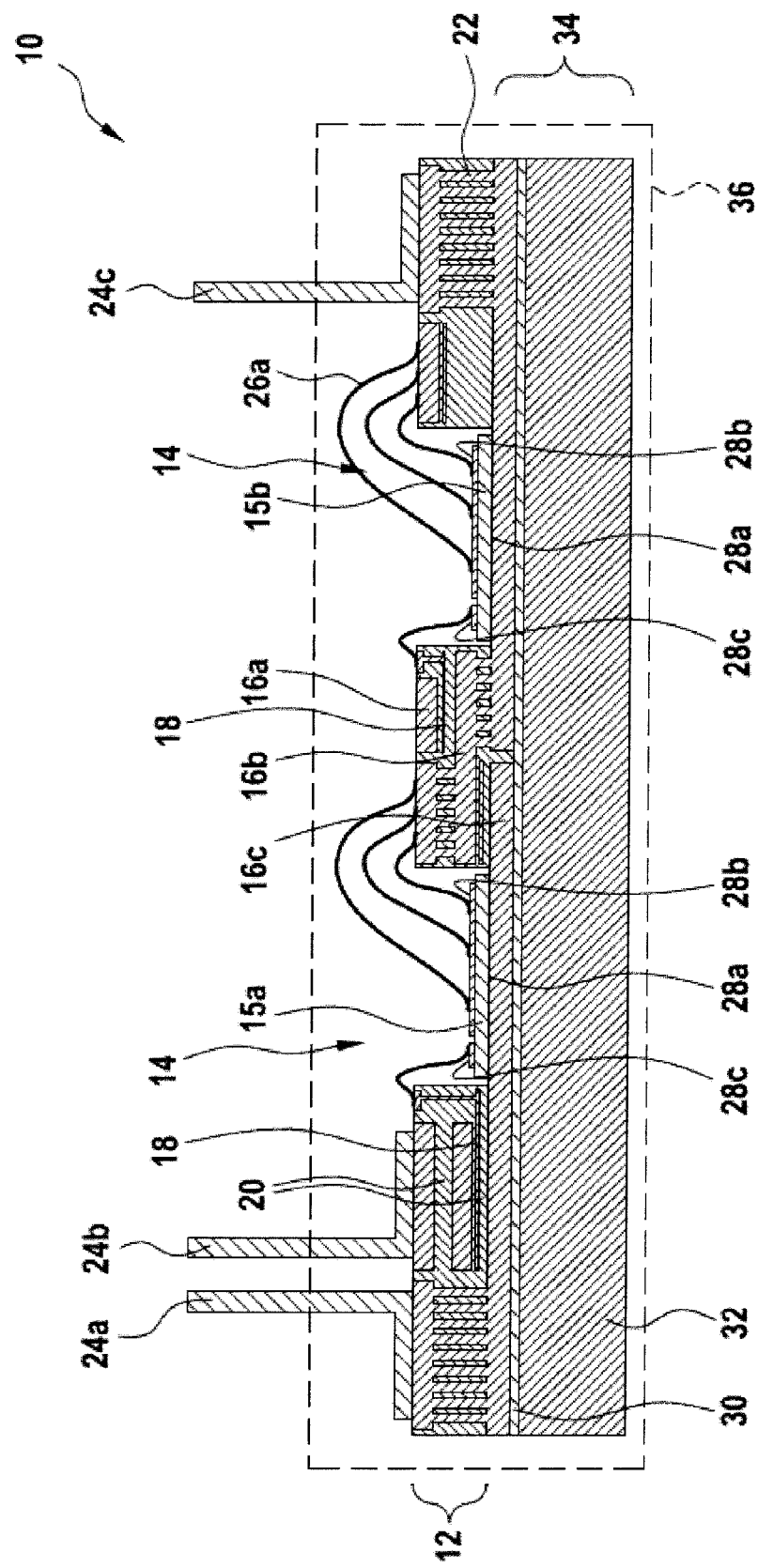
FIG. 1 schematically shows a cross-section through a power module according to an embodiment of the invention.

FIG. 1 shows a power module 10 comprising a multi-layer circuit board 12, which comprises cavities 14, in which power semiconductor devices 15a, 15b (for example SiC MOSFETs) are provided.

The multi-layer circuit board 12 comprises three thick layers 16a, 16b, 16c (about 300 μm thick) and two thin layers 18 (thinner than the thick layers 16a, 16b, 16c, about 75 μm thick), each of which is situated between two thick layers 16a, 16b, 16c. The thick layers 16a, 16b, 16c are used for current routing through the power module 10. The thin layers 18 are used for routing of gate signals through the power module 10.

Between the layers 16a, 16b, 16c, 18, the multi-layer circuit board 12 comprises isolation layers 20, which are based on prepreg material (such as fibre enforced epoxy resin). All the layers 16a, 16b, 16c, 18, 20 of the multi-layer circuit board 12 have been joined/laminated together by pressing under heat to form the multi-layer circuit board 12. The electrically conducting layers 16a, 16b, 16c, 18 are electrically interconnected with vias 22, which reach through the electrically isolating layers 20. The layers 16a, 16b, 16c, 18 and the vias 22 may be made of Cu.

Each cavity 14 may protrude through at least two electrically conducting layers 16a, 16b, 18 and/or at least two isolation layers 20. Sidewalls of a cavity 14 may extend substantially vertical, i.e. orthogonally to an extension of the layers 16a, 16b, 16c, 18, 20. The sidewalls of a cavity 14 may be covered with isolation material from the isolation layers 20.

The top layer 16a provides contact areas for a DC+ terminal 24a, DC− terminal 24b, AC terminal 24c and one or more gate terminals (not shown). These terminals 24a, 24b, 24c may be bonded to the top layer 16a and/or may be provided by folded metal strips.

The terminals 24a, 24b, 24c (as well as the gate terminals), which are used as external power connections of the power module 10, may be provided as terminals for screw connections and/or press-in pins and/or lead frame structures. The terminals 24a, 24b, 24c (as well as the gate terminals) may be directly attached to or integrated into the multi-layer circuit board 12.

The power terminals 24a, 24b, 24c may reach out vertically from the multi-layer circuit board 12 as shown in FIG. 1, i.e. in a direction substantially orthogonal to the extension of the layers 16a, 16b, 16c, 18, 20. Alternatively, power terminals 24a, 24b, 24c may reach out horizontally towards the sides of the power module 10, i.e. in a direction substantially parallel to the extension of the layers 16a, 16b, 16c, 18, 20. The DC− terminal 24b and the DC+ terminal 24a may be provided on one side and the AC terminal 24c on an opposite side of the power module 10. In this case, the power module 10 may be flat and enough room on the top side of the power module 10 may be left for attachment of a gate drive circuit board.

The gate terminals also may reach out vertically from the multi-layer circuit board 12 (for example using pins or sockets to connect to a gate drive circuit board) or also horizontally using a lead frame structure.

The power terminals 24a, 24b, 24c and/or the gate terminals are attached to the top layer 16a by soldering, sintering or welding. It also may be possible that the power terminals 24a, 24b, 24c and/or the gate terminals are already integrated during the manufacturing of the multi-layer circuit board 12.

The bottom layer 16c provides a bottom of the cavities 14 to which the power semiconductor devices 15a, 15b are bonded with a bottom side, for example by Ag sintering. The top side of the power semiconductor devices 15a, 15b are electrically connected to the top side of the multi-layer circuit board 12 via conducting members in the form of wirebonds 26a.

In particular, the bottom side of each semiconductor devices 15a, 15b provides a bottom contact area 28a (providing the source of the semiconductor device 15a, 15b), which is bonded to the bottom layer 16c. The top side of each semiconductor devices 15a, 15b provides a top contact area 28b (providing the drain of the semiconductor device 15a, 15b) and a gate contact area 28c. The top contact area 28b is electrically connected via a plurality of wirebonds 26a with a corresponding contact area provided by the top layer 16a. The gate contact area 28c is electrically connected via one wirebond 26a with a corresponding contact area provided by the top layer 16a.

The power semiconductor devices 15a, 15b are completely received in their respective cavity 14, i.e. their top side does not protrude over the top side of the multi-layer circuit board 12.

In FIG. 1, the bottom layer 16c is an integral part of the multi-layer circuit board 12. Thus, the cavities 14 do not reach completely through the multi-layer circuit board 12.

The bottom layer 16c may be attached via a further isolation layer 30 to a base metal layer 32, which may be used for supporting the power module 10 and/or for cooling the power semiconductor devices 15a, 15b.

It may be possible that the isolation layer 30 and the base metal layer 32 are joined with the multi-layer circuit board 12 after the manufacturing of the multi-layer circuit board 12. However, it also may be possible that the bottom layer 16c, the isolation layer 30 and the base metal layer 32 are provided by an isolated metal substrate 34, which is integrated into the multi-layer circuit board 12, i.e. joined with the multi-layer circuit board 12 during the manufacturing of the multi-layer circuit board 12.

It also may be possible to integrate a ceramics substrate into the multi-layer circuit board 12. FIG. 1 further shows that the assembly of the multi-layer circuit board 12, the layers 30, 32 and the terminals 24a, 24b, 24c may be encased into a plastics material encasing 36, which may be based on an epoxy molding compound. The encasing 36 may leave exposed only the base metal layer 32 for cooling and/or the terminals/pins 24a, 24b, 24c for external connection. An epoxy-molded module 10 may provide good mechanical robustness as well as sufficient temperature capability and protection against moisture ingress under harsh conditions.

Figure 2:
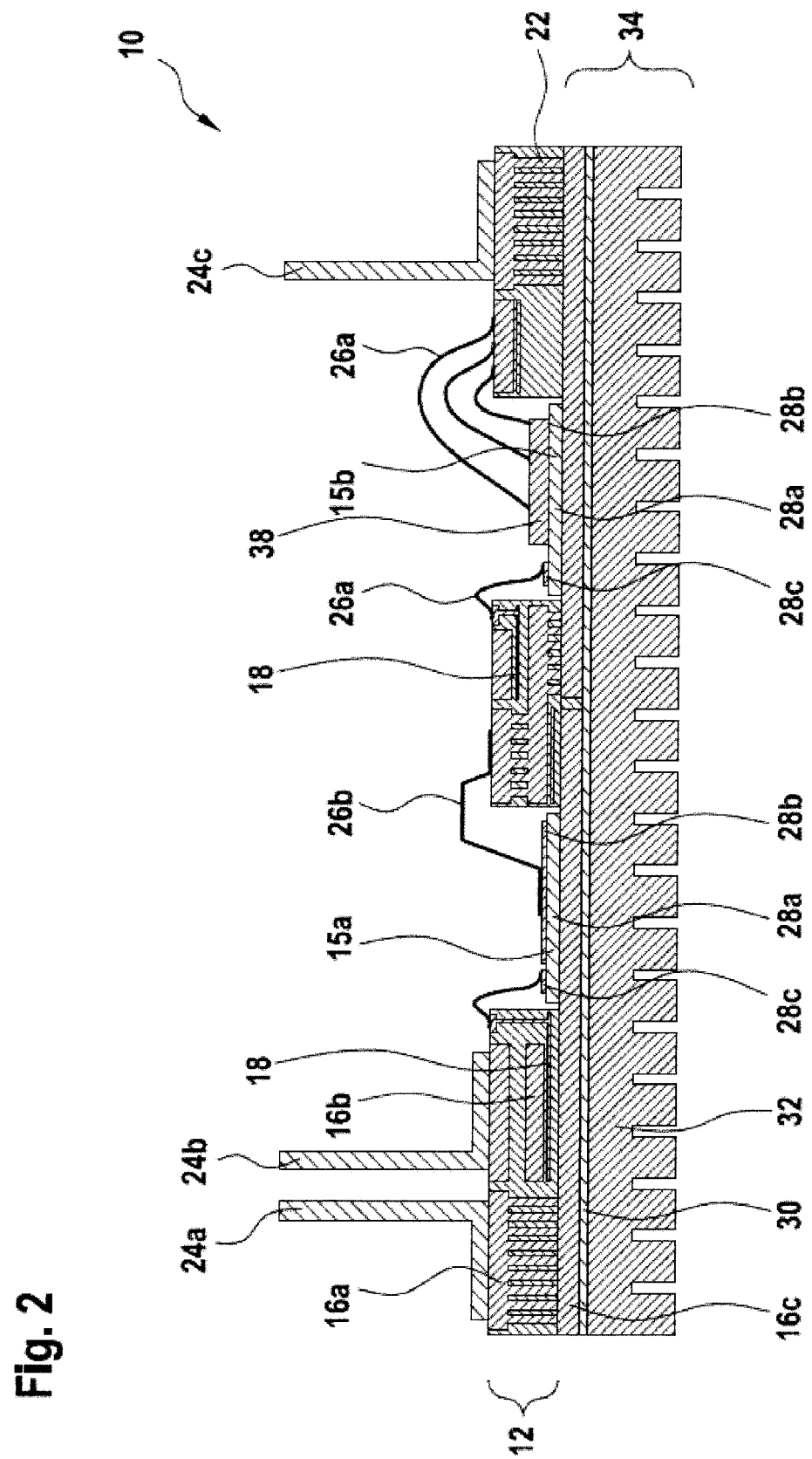
FIG. 2 schematically shows a cross-section through a power module according to a further embodiment of the invention.

FIG. 2 shows a power module 10, in which the multi-layer circuit board 12 comprises only the thick layers 16a, 16b, the thin layers 18 and the isolation layers 20 between them. The bottom layer 16c is provided by an isolated metal substrate 34, which has been bonded to the multi-layer circuit board 12 after the manufacturing of the multi-layer circuit board 12.

FIG. 2 also shows an alternative for wirebonds 26a as conducting members, which may be Al, Cu or Ag wirebonds. The top side and top electrical contact area 28b of the power semiconductor device 15a (and also of 15b) may be bonded to a metal strip 26b, which is also bonded to a corresponding contact area provided by the top layer 16a on the top side of the multi-layer circuit board 12. The metal strip 26b may be a Cu, Al or Ag strip/clip soldered or sintered to the top contact area 28b and to the corresponding contact area provided by the top layer 16a.

Furthermore, a metal buffer layer 38 may be bonded to the top contact area 28b. The conducting members 26a, 26b may be bonded to this metal buffer layer 38. The metal buffer layer 38 may be bonded to the corresponding power semiconductor device 15a, 15b already on the wafer level. Such a metal buffer layer 38 may improve the power cycling capability of the wirebonds 26a and may provide an additional thermal mass on the top side of the power semiconductor device 15a, 15b.

As shown in FIG. 2, the base metal layer 32 may be structured for providing a cooling surface of the power module 10. The power semiconductor devices 15a, 15b may be in good thermal contact with the base metal layer 32 via the bottom layer 16c. The bottom layer 16c only may be insulated with respect to the base metal Cu or Ag layer 32 by a thin isolation layer 30. The isolation layer 30 may be based on thermal prepreg and/or may have a thickness of about 100 um. The thermal conductivity of the insulation layer 30 may be about 10 W/mK, which means that such an insulated metal substrate 34 even may compete with ceramic substrates in terms of thermal performance.

Figure 3:
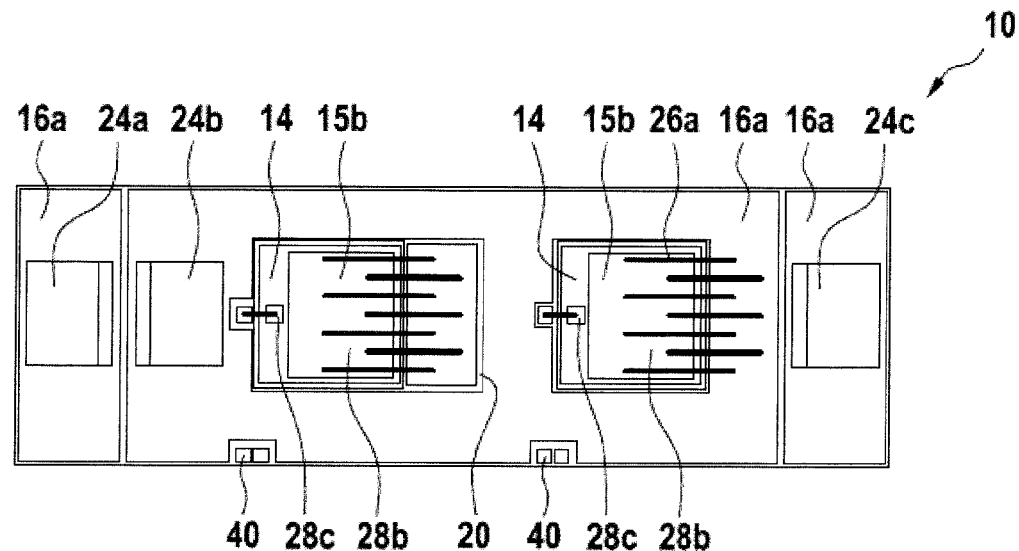
FIG. 3 schematically shows a top view onto a power module according to a further embodiment of the invention.

FIG. 3 shows a power module 10 from above. For example, the power module 10 from FIG. 1 may have such a top side. FIG. 3 shows that the top layer 16a is divided into several electrically disconnected parts, that provide the contact areas for the terminals 24a, 24b, 24c, and the conducting members 26a, 26b (wirebonds and/or metal strips) for the top contact areas 28b and the gate contact areas 28c. Furthermore, contact areas 40 for gate terminals are shown in FIG. 3.

Also the other layers 16b, 16c, 18 may comprise such disconnected parts, which are separated by isolation material based on the prepreg material used for the forming of the multi-layer circuit board.

As shown in FIG. 3, the electrically conducting parts of the layers 16a, 16b, 16c may extend over a large extent of the base area of the multi-layer circuit board 12, for example over more than 50% of the base area.

The semiconductor devices 15a, 15b may be electrically interconnected by the thick layers 16a, 16b, 16c to form a half-bridge (see below FIG. 4), which carry the DC+, AC, and DC− potential provided to the terminals 24a, 24b, 24c. To ensure sufficient current carrying capability, the layers 16a, 16b, 16c may be thick Cu layers with a thickness in the order of 300 μm. To ensure a low inductance current path, the current carrying layers 24a, 24b, 24c are formed as planar layers extending over as much of the base area as possible. In this way, for example, the DC− parts provided by the layers 24a, 24b, 24c extend in a large area parallel to the DC+ parts of the layer 24a, 24b, 24c, for example at a distance of only in the order of 1 mm.

Furthermore, the DC− terminal 24b may be arranged close to the DC+ terminal 24a in a strip-line fashion.

This may ensure a low commutation loop stray inductance of the power module 10. Also, the parts of the gate layers 18 may also run in a large area in parallel to the layers 16a, 16b, 16c. This large-area planar gate layer approach also may ensure a low gate inductance and may reduce a coupling between the gate signals and the current in the layers 16a, 16b, 16c.

It should be noted that further conducting layers may be added, for example, for additional signals such as an on-chip temperature or a signal from a current sensor.

Figure 4:
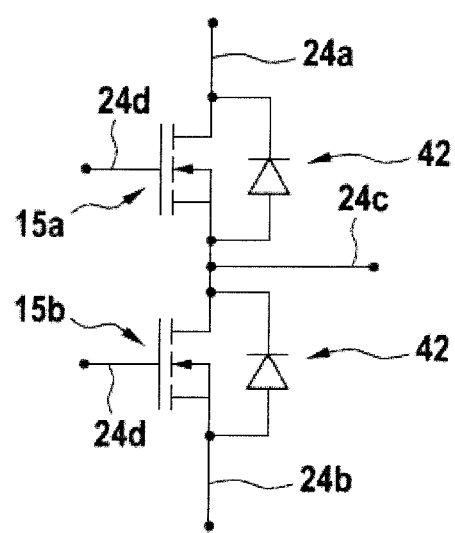
FIG. 4 shows a circuit diagram for a power module according to an embodiment of the invention.

FIG. 4 shows that the semiconductor devices 15a, 15b (MOSFETs) may be electrically interconnected to form a half-bridge. Also freewheeling diodes 42 may be interconnected antiparallel to the semiconductor devices 15a, 15b. These freewheeling diodes 42 may be provided by the chips of the semiconductor devices 15a, 15b or may be provided in cavities 14 bonded with one side to the bottom layer 16c and electrically connected via conducting members 26a, 26b with the top side of the multi-layer circuit board 12. The layers 16a, 16b, 16c then may provide an electrical connection between the freewheeling diodes 42 and the semiconductor devices 15a, 15b.

Figure 5:
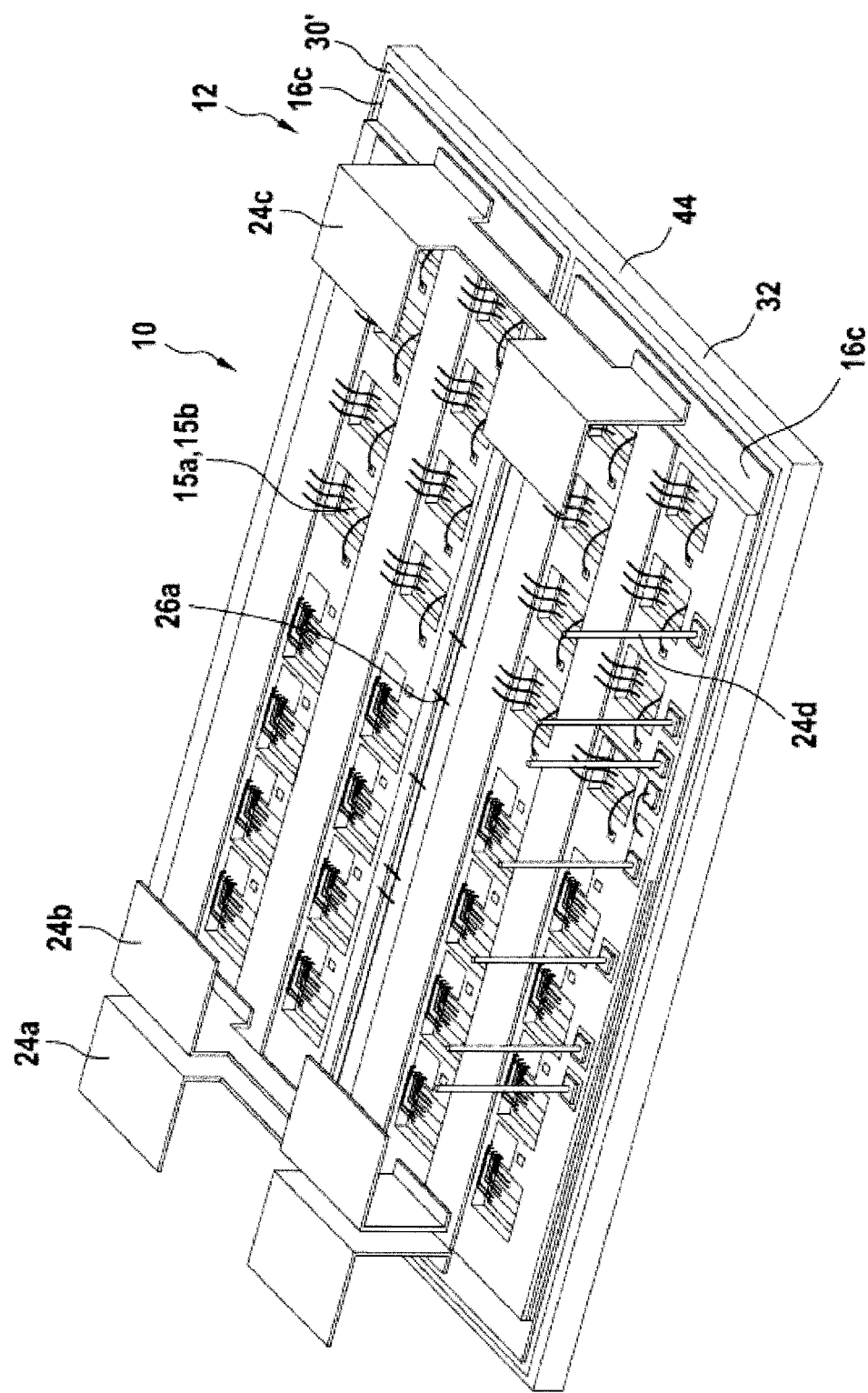
FIG. 5 schematically shows a perspective view of a power module according to a further embodiment of the invention.

FIG. 5 shows a power module 10 that comprises two multi-layer circuit boards 12, which are bonded to the same ceramics substrate 44, which may comprise the bottom layer 16c, a ceramics layer 30' and a base metal layer 32 that may be used for cooling. In FIG. 5, the ceramics substrate 44 provides two electrically isolated bottom layers 16*c*.

As shown in FIG. 5, when the power module 10 comprises multiple paralleled half-bridges provided by multi-layer circuit boards 12, wirebonds 26*a* may be used to route the gate signals from one multi-layer circuit board 12 to another and only one gate terminal 24*d* per low side and high side may be needed.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS

10 power module
12 multi-layer circuit board
14 cavity
15*a* power semiconductor device
15*b* power semiconductor device
16*a* top layer
16*b* intermediate layer
16*c* bottom layer
18 gate layer
20 isolation layer
22 via
24*a* DC+ terminal
24*b* DC− terminal
24*c* AC terminal
24*d* gate terminal
26*a* conducting member (wirebond)
26*b* conducting member (metal strip)
28*a* bottom contact area
28*b* top contact area
28*c* gate contact area
30 isolation layer
32 base metal layer
34 isolated metal substrate
36 encasing
38 metal buffer layer
40 gate contact area
42 freewheeling diode
44 ceramics substrate

The invention claimed is:

1. A power module, comprising:
at least one power semiconductor device with an electrical top contact area on a top side;
a multi-layer circuit board with multiple electrically conducting layers and an electrically conducting bottom layer which are separated by multiple electrically isolating layers, the multiple electrically isolating layers being laminated together with the electrically conducting layers and the electrically conducting bottom layer, which is provided at a bottom side of the multi-layer circuit board;
wherein the multi-layer circuit board has at least one cavity, which is opened to a top side of the multi-layer circuit board, which the at least one cavity reaches through the multiple electrically conducting layers and the multiple electrically isolating layers and the at least one cavity reaches through the multi-layer circuit board to the electrically conducting bottom layer;
wherein the at least one power semiconductor device is electrically connected to a top side of the multi-layer circuit board with a conducting member bonded to the top contact area and bonded to the top side of the multi-layer circuit board;
wherein the power semiconductor device is bonded with a bottom contact area to the electrically conducting bottom layer;
wherein the electrically conducting bottom layer is part of an insulated metal substrate that forms an integral part of the multi-layer circuit board, the insulated metal substrate comprising the electrically conducting bottom layer and a further metal layer isolated from the electrically conducting bottom layer by a further isolation layer different from the multiple electrically isolating layers.

2. The power module of claim 1,
wherein the electrically conducting bottom layer is part of a ceramics substrate comprising the electrically conducting bottom layer attached to a ceramics layer.

3. The power module of claim 1,
wherein the multi-layer circuit board comprises at least two multi-layer circuit boards that have at least one cavity, in which power semiconductor devices are bonded, are attached to a common substrate.

4. The power module of claim 1,
wherein the electrically conducting bottom layer or a metal layer attached to the electrically conducting bottom layer has a structured bottom surface for cooling.

5. The power module of claim 1,
wherein the at least one power semiconductor device is completely received in the at least one cavity.

6. The power module of claim 1,
wherein the at least one power semiconductor device has a gate contact area on the top side, which is electrically connected with the conducting member to the top side of the multi-layer circuit board.

7. The power module of claim 1,
wherein the multi-layer circuit board comprises at least two cavities, in which at least two power semiconductor devices are attached with bottom sides to the bottoms of the cavities; and/or
wherein each of the at least one power semiconductor device is positioned in a separate cavity.

8. The power module of claim 1,
wherein the at least one power semiconductor device is electrically connected via wirebonds as the conducting member to the top side of the multi-layer circuit board; and/or
wherein the at least one power semiconductor device is electrically connected via a metal strip as the conducting member to the top side of the multi-layer circuit board.

9. The power module of claim 1,
wherein a metal buffer layer is bonded to the top contact area of the at least one power semiconductor device and the conducting member interconnecting the top contact area with the top side of the multi-layer circuit board is bonded to the metal buffer layer.

10. The power module of claim 1,
wherein a first electrically conducting layer and a second electrically conducting layer electrically connected to the top contact area and the bottom contact area of the at least one power semiconductor device are overlapping each other in at least more than 10% of an area of the top side or the bottom side of the multi-layer circuit board; and/or
wherein the first electrically conducting layer and/or the second electrically conducting layer extend over more than 50% of the area of the top side or bottom side of the multi-layer circuit board.

11. The power module of claim 1,
wherein a first electrically conducting layer and/or a second electrically conducting layer electrically connected to the top and/or bottom contact areas of the at least one power semiconductor device are thicker than a third electrically conducting layer electrically interconnected with a gate contact area of the power semiconductor device.

12. The power module of claim 1,
wherein the multiple electrically conducting layers of the multi-layer circuit board are interconnected by conducting vias extending through the multi-layer circuit board orthogonally to the multiple electrically conducting layers.

13. The power module of claim 1,
wherein the power module comprising at least two power semiconductor switches electrically interconnected by the electrically conducting layers of the multi-layer circuit board, the bottom layer and the conducting member to form a half-bridge.

14. The power module of claim 1,
wherein terminals for connecting an external connection of the power module are directly bonded to the top side of the multi-layer circuit board and/or are part of the multi-layer circuit board.

15. The power module of claim 1,
wherein the multi-layer circuit board and the at least one power semiconductor device in the cavity are encapsulated into a plastics material.

16. The power module of claim 2, wherein the multi-layer circuit board comprises at least two multi-layer circuit boards that have at least one cavity in which power semiconductor devices are bonded, are attached to a common substrate.

17. The power module of claim 2, wherein the electrically conducting bottom layer or a metal layer attached to the electrically conducting bottom layer has a structured bottom surface for cooling.

18. The power module of claim 3, wherein the electrically conducting bottom layer or a metal layer attached to the electrically conducting bottom layer has a structured bottom surface for cooling.

19. The power module of claim 2, wherein the at least one power semiconductor device is completely received in the at least one cavity.

20. The power module of claim 3, wherein the at least one power semiconductor device is completely received in the at least one cavity.

* * * * *